United States Patent
Fujisawa

(10) Patent No.: US 9,111,791 B2
(45) Date of Patent: Aug. 18, 2015

(54) STACKED TYPE SEMICONDUCTOR DEVICE AND PRINTED CIRCUIT BOARD

(71) Applicant: CANON KABUSHIKI KAISHA, Tokyo (JP)

(72) Inventor: Yoshitomo Fujisawa, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/349,653

(22) PCT Filed: Oct. 3, 2012

(86) PCT No.: PCT/JP2012/006328
§ 371 (c)(1),
(2) Date: Apr. 3, 2014

(87) PCT Pub. No.: WO2013/051247
PCT Pub. Date: Apr. 11, 2013

(65) Prior Publication Data
US 2014/0231996 A1    Aug. 21, 2014

(30) Foreign Application Priority Data

Oct. 7, 2011 (JP) ................................. 2011-222732
Sep. 19, 2012 (JP) ................................. 2012-205973

(51) Int. Cl.
*H01L 23/48* (2006.01)
*H01L 25/10* (2006.01)
(Continued)

(52) U.S. Cl.
CPC ............ *H01L 25/105* (2013.01); *H01L 23/488* (2013.01); *H01L 23/49816* (2013.01); *H05K 3/3484* (2013.01); *H01L 23/485* (2013.01); *H01L 2225/1023* (2013.01); *H01L 2225/1058* (2013.01); *H01L 2924/014* (2013.01); *H01L 2924/01029* (2013.01); *H01L 2924/15311* (2013.01); *H01L 2924/15331* (2013.01);
(Continued)

(58) Field of Classification Search
CPC ... H01L 23/481; H01L 23/485; H01L 23/498; H01L 23/49816; H01L 25/105; H05K 1/09
USPC .................................................. 257/686, 746
See application file for complete search history.

(56) References Cited

U.S. PATENT DOCUMENTS 6,013,713 A    1/2000  Cotte
8,120,188 B2 *  2/2012  Sakurai et al. ................ 257/778
(Continued)

FOREIGN PATENT DOCUMENTS

JP    2008-235378 A    10/2008

*Primary Examiner* — Nathan Ha
(74) *Attorney, Agent, or Firm* — Canon USA Inc IP Division

(57) ABSTRACT

The printed circuit board (100) includes the interposer (2) where the semiconductor element (1) is mounted and the electrode pad (8) is formed on one surface, the printed wiring board (3) where the electrode pad (9) is formed on one surface facing the interposer (2), and the joint material (70) for bonding the electrode pads (8) and (9). The joint material (70) includes the solder layer (60) formed by the solder material (11) and the metal layers (50), (50) provided to the electrode pads (8) and (9). Each metal layer (50) includes the metal particle aggregate (10) in which metal particles are integrated with voids and is formed by filling the voids in the metal particle aggregate (10) with melted solder material (11). It is possible to ensure the height of the solder, improve reliability of the bonding, and downsize the semiconductor device by using such joint material.

17 Claims, 12 Drawing Sheets

(51) Int. Cl.
*H01L 23/488* (2006.01)
*H01L 23/498* (2006.01)
*H05K 3/34* (2006.01)
*H05K 1/09* (2006.01)
*H01L 23/485* (2006.01)
*H05K 1/02* (2006.01)

(52) U.S. Cl.
CPC ............... *H05K1/0271* (2013.01); *H05K 1/09* (2013.01); *H05K 2201/10378* (2013.01); *H05K 2201/10734* (2013.01); *H05K 2203/0425* (2013.01)

(56) References Cited

U.S. PATENT DOCUMENTS

| | | | |
|---|---|---|---|
| 8,426,964 B2 * | 4/2013 | Uang et al. | 257/737 |
| 2006/0163744 A1 | 7/2006 | Vanheusden | |
| 2008/0145607 A1 | 6/2008 | Kajiwara | |
| 2008/0156398 A1 * | 7/2008 | Yasuda et al. | 148/23 |
| 2010/0001411 A1 * | 1/2010 | Sawada et al. | 257/778 |
| 2010/0052189 A1 * | 3/2010 | Sakurai et al. | 257/778 |
| 2010/0213609 A1 | 8/2010 | Kondou | |
| 2010/0295177 A1 * | 11/2010 | Ouchi | 257/737 |
| 2011/0038124 A1 * | 2/2011 | Burnham et al. | 361/717 |
| 2011/0156271 A1 | 6/2011 | Kawabata | |
| 2011/0290863 A1 * | 12/2011 | Kajiwara et al. | 228/227 |
| 2012/0305298 A1 * | 12/2012 | Uang et al. | 174/257 |

\* cited by examiner

STACKED TYPE SEMICONDUCTOR DEVICE AND PRINTED CIRCUIT BOARD

TECHNICAL FIELD

The present invention relates to a stacked type semiconductor device and a printed circuit board which include a joint material that bonds electrode pads together.

BACKGROUND ART

In recent years, digital devices such as a digital camera and a digital video camera are becoming lighter, thinner, shorter, and smaller and semiconductor devices in which many electronic components are mounted in a smaller space are used. A stacked type semiconductor device in which a plurality of semiconductor devices are stacked attracts attention. The stacked type semiconductor device is formed by bonding a semiconductor package by a joint material such as solder onto another semiconductor package in which a semiconductor element is mounted on an interposer.

The mainstream of semiconductor devices is a semiconductor package of BGA (Ball Grid Array) in which solder balls are used as joint materials which are external connection electrode. Among the BGAs, a semiconductor package, such as a CSP (Chip Size Package), which includes an interposer slightly larger than or equal to a semiconductor element, is increasingly employed.

Generally, thermal deformation such as warping occurs in the interposer due to heat generation when the semiconductor element operates. At this time, the solder used as the joint material is the softest of components of the semiconductor device and a printed wiring board on which the semiconductor device is mounted, so that the solder has a function to absorb a difference of coefficient of thermal expansion between the interposers or between the interposer and the printed wiring board. At this time, shear stress is concentrated to the solder.

When the semiconductor device is mounted on the printed wiring board, the shear stress generated in the solder, which is the joint material, is evaluated by a strain value obtained by dividing a difference between the amount of thermal deformation of the interposer of the semiconductor device and the amount of thermal deformation of the printed wiring board by the height of the solder, which is the joint material. When the semiconductor device is a stacked type semiconductor device, the shear stress is evaluated by a strain value obtained by dividing a difference between the amount of thermal deformation of the interposer of an upper semiconductor device and the amount of thermal deformation of the interposer of a lower semiconductor device by the height of the solder which is the joint material. The larger the strain value, the more the shear stress is concentrated and the easier a bonding portion is broken. Therefore, the smaller the diameter of the solder ball is set to in order to further downsize the semiconductor device, the larger the strain value and the easier the solder ball, which is the bonding portion, is broken.

In a stacked type semiconductor device, an interposer is further stacked and coupled onto another interposer on which a semiconductor element is mounted, so that a height higher than a height of the semiconductor element mounted on the lower interposer is required for the bonding portion (external connection electrode) connecting the upper and the lower interposers together. Therefore, when the diameter of the solder ball, which is the bonding portion, is simply reduced in order to downsize the semiconductor device, the height of the bonding portion cannot be higher than or equal to the height of the semiconductor element mounted on the lower interposer.

PTL 1 describes that a cylindrical metal post is formed on an electrode pad of the lower interposer and the solder ball is disposed on the metal post in order to ensure the height of the bonding portion.

However, in the case of the configuration described in PTL 1, when the diameter of the solder ball is decreased, the strain value described above increases and cracks tend to occur in the interface between the solder ball and the metal post. In particular, a shear stress is concentrated on the interface between the solder ball and the metal post where the physical property of materials drastically changes, so that there is a problem that long term reliability cannot be ensured.

CITATION LIST

Patent Literature

PTL 1: Japanese Patent Laid-Open No. 2008-235378

SUMMARY OF INVENTION

Therefore, the present invention provides a structure of a joint material that can improve reliability of bonding while ensuring the height of the joint material and a semiconductor device whose area can be reduced by using the joint material.

The present invention provides a stacked type semiconductor device having a first semiconductor device which includes a first semiconductor element and a first interposer where the first semiconductor element is mounted, a first electrode pad is formed on one surface, and an external electrode for connecting to the outside is formed on the other surface, a second semiconductor device which is stacked on the first semiconductor device and which includes a second semiconductor element and a second interposer where the second semiconductor element is mounted and a second electrode pad is formed on a surface facing the first interposer, and a joint material configured to bond the first electrode pad and the second electrode pad together. A solder layer and a metal layer bonded to at least one of the first and the second electrode pads are stacked in the joint material. The metal layer includes a metal particle aggregate in which a plurality of metal particles are integrated with voids, and solder which fills the voids in the metal particle aggregate.

According to the present invention, the joint material includes a solder layer and a metal layer including a metal particle aggregate and the metal layer is formed by filling melted solder material into voids in the metal particle aggregate, so that there is no portion in which the physical property of materials drastically changes in the interface portion between the solder layer and the metal layer. Therefore, it is possible to prevent a shear load from being concentrated to the interface portion between the solder layer and the metal layer, so that the strain generated in the solder material can be alleviated. Further, the voids in the metal particle aggregate are filled with the solder material that absorbs the shear load, so that the height of the solder in the joint material is higher than the height of the solder layer only. In other words, not only the solder layer, but also the solder material filled into the voids in the metal particle aggregate absorbs the shear load, so that the strain generated in the solder material can be efficiently alleviated. Thereby, it is possible to ensure the height of the joint material and improve the reliability of the joint material.

Further features of the present invention will become apparent from the following description of exemplary embodiments with reference to the attached drawings.

DESCRIPTION OF EMBODIMENTS

Hereinafter, embodiments for implementing the present invention will be described with reference to the drawings.

First Embodiment

Figure 1A:
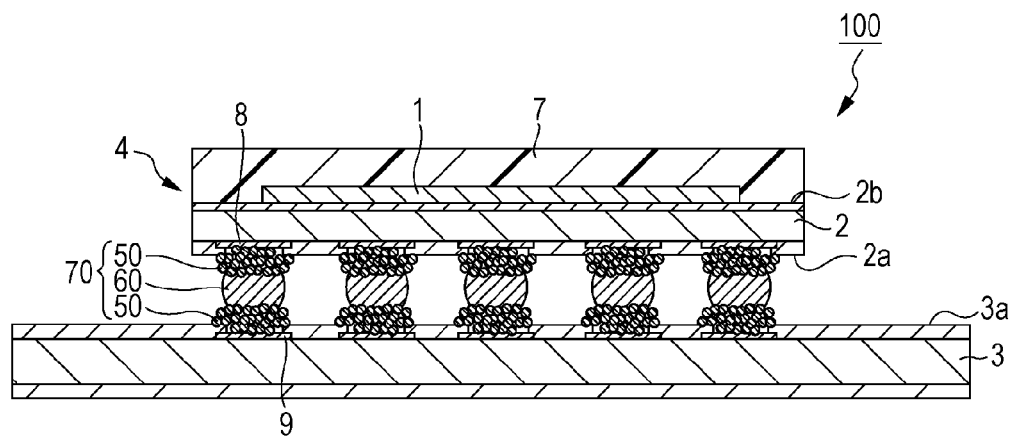
FIG. 1A is an illustration showing a schematic configuration of a printed circuit board according to a first embodiment.
Figure 1B:
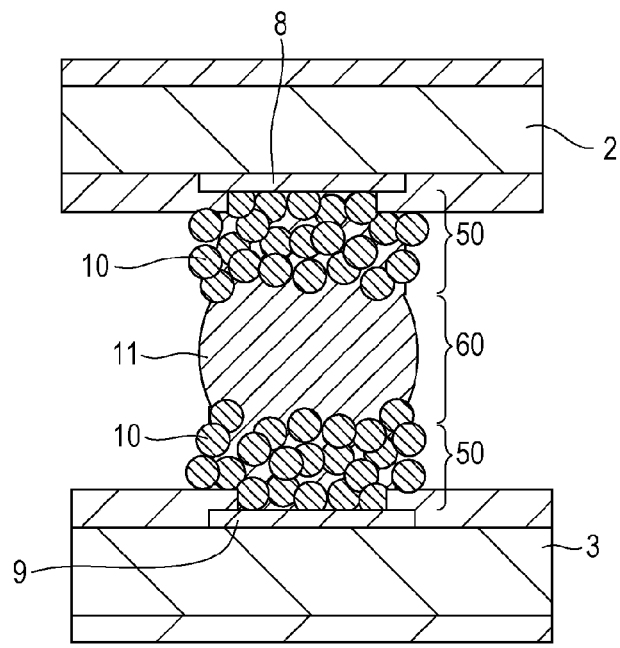
FIG. 1B is an illustration showing a schematic configuration of the printed circuit board according to the first embodiment.

FIGS. 1A and 1B are illustrations showing a schematic configuration of a printed circuit board according to a first embodiment of the present invention. FIG. 1A is a schematic cross-sectional view of the entire printed circuit board. FIG. 1B is a partial enlarged view of a bonding portion.

As shown in FIG. 1A, a printed circuit board 100 includes a printed wiring board (mother board) 3 as a wiring substrate and a semiconductor device 4 mounted on the printed wiring board 3.

The semiconductor device 4 is a semiconductor package having a semiconductor element 1 including a semiconductor chip such as a CPU and an interposer 2 as a wiring substrate on which the semiconductor element 1 is mounted. One surface (one side) 2a of the interposer 2 and one surface (one side) 3a of the printed wiring board 3 face each other. The semiconductor element 1 is mounted on the other surface 2b of the interposer 2 and sealed along with the surface 2b by a sealing resin 7.

A plurality of electrode pads 8 are formed with a distance from each other on the surface 2a of the interposer 2. A plurality of electrode pads 9 facing the electrode pads 8 are formed with a distance from each other on the surface 3a of the printed wiring board 3. For example, the electrode pads 8 and 9 are arranged at an equal interval in an array form. The electrode pad 8 and the electrode pad 9 are bonded together by a joint material 70 which is a connection electrode. The electrode pad 8 and the electrode pad 9 are electrically connected together by the joint material 70.

Here, one of the interposer 2 and the printed wiring board 3 is a first wiring substrate on which first electrode pads are formed and the other is a second wiring substrate on which second electrode pads are formed. In other words, when the interposer 2 is the first wiring substrate, the electrode pad 8 is the first electrode pad, the printed wiring board 3 is the second wiring substrate, and the electrode pad 9 is the second electrode pad. When the printed wiring board 3 is the first wiring substrate, the electrode pad 9 is the first electrode pad, the interposer 2 is the second wiring substrate, and the electrode pad 8 is the second electrode pad.

As shown in FIG. 1B, the joint material 70 includes a solder layer 60 formed by a solder material 11 and metal layers 50 and 50 which are provided to both electrode pads 8 and 9 and to which the solder layer 60 is attached. In short, the joint material 70 has a structure in which the metal layer 50, the solder layer 60, and the metal layer 50 are stacked.

Each of the metal layers 50 and 50 includes a porous metal particle aggregate 10 in which metal particles are integrated with voids. The metal particle aggregates 10 and 10 are bonded to the electrode pads 8 and 9 respectively. Many voids are formed in each metal particle aggregate 10 and melted solder material 11 flows into the voids. The melted solder material 11 is flowed into the voids in the metal particle aggregate 10 to fill the voids with the solidified solder material 11, so that the metal layer 50 and the solder layer 60 are bonded together. At this time, the metal particle aggregate 10 is metal-bonded to the solder material 11 through a compound of the metal particle aggregate 10 and the solder material 11 and the voids in the metal particle aggregate 10 are filled with the solder material 11. As a result, the solder material 11 is filled into the voids in the metal particle aggregate 10 until the solder material 11 reaches the electrode pad 9 formed on the printed wiring board 3 and the electrode pad 8 formed on the interposer 2 and the electrode pad 8 and the electrode pad 9 are bonded together by the solder material 11.

When the metal particle aggregate 10 is a material having good wettability to the solder material 11, the solder material 11 can fill the voids in the metal particle aggregate 10, so that metal particle aggregate 10 can be formed by copper or a copper alloy including copper as a main component. Further, the metal particle aggregate 10 can be formed by an alloy including copper as a main component and further including tin, which can be manufactured easily.

Figure 2A:
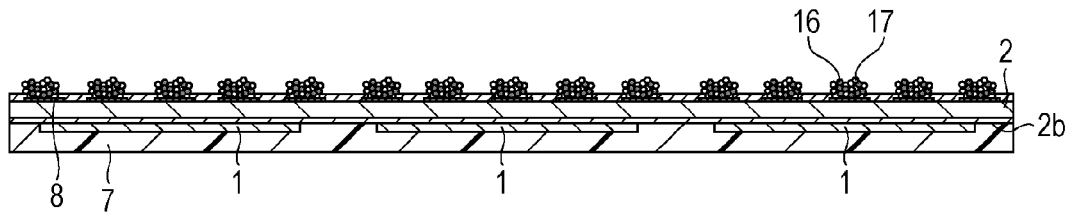
FIG. 2A is a schematic diagram for explaining a process of bonding together a printed wiring board and a semiconductor device.
Figure 2B:
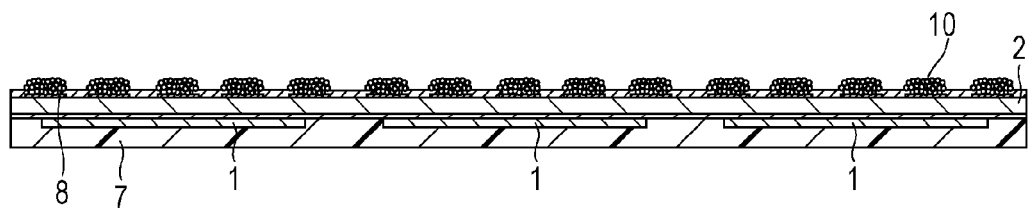
FIG. 2B is a schematic diagram for explaining a process of bonding together the printed wiring board and the semiconductor device.
Figure 2C:
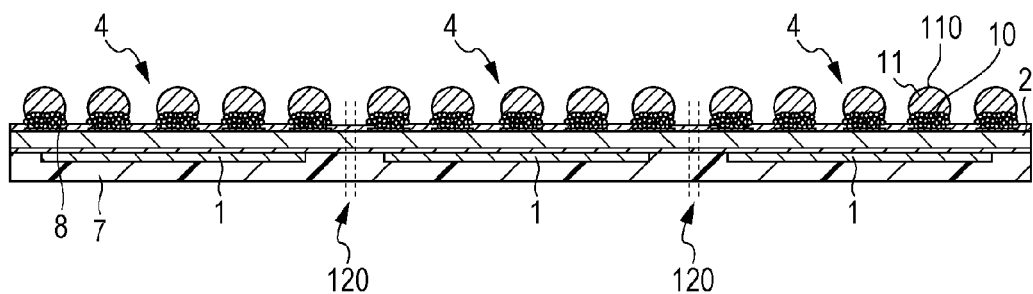
FIG. 2C is a schematic diagram for explaining a process of bonding together the printed wiring board and the semiconductor device.
Figure 2D:
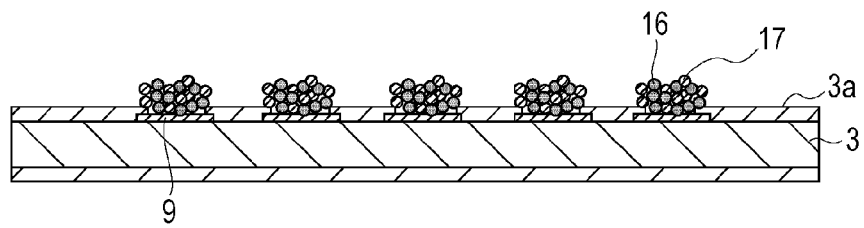
FIG. 2D is a schematic diagram for explaining a process of bonding together the printed wiring board and the semiconductor device.
Figure 2E:
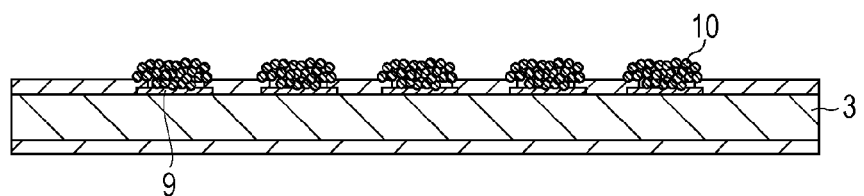
FIG. 2E is a schematic diagram for explaining a process of bonding together the printed wiring board and the semiconductor device.
Figure 2F:
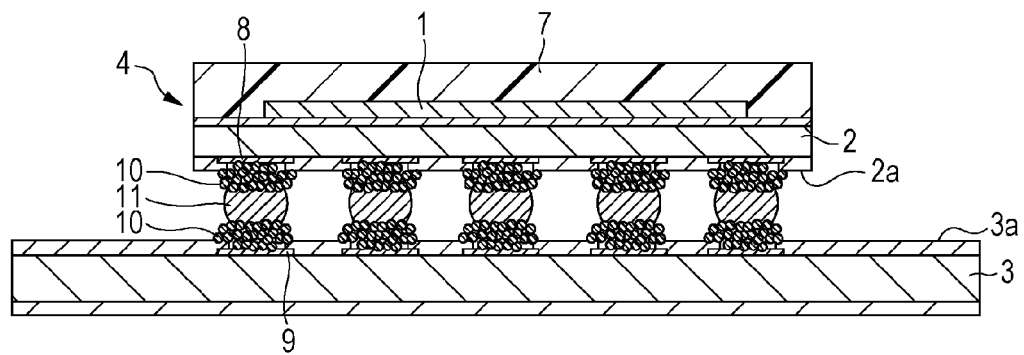
FIG. 2F is a schematic diagram for explaining a process of bonding together the printed wiring board and the semiconductor device.

Next, a manufacturing method of the printed circuit board 100 of the first embodiment will be described with reference to FIGS. 2A to 2F. FIGS. 2A to 2F are schematic diagrams for explaining processes of bonding together the printed wiring board 3 and the semiconductor device 4. FIG. 2A shows a first metal particle supply process. FIG. 2B shows a first metal particle aggregate formation process. FIG. 2C shows a solder material supply process. FIG. 2D shows a second metal particle supply process. FIG. 2E shows a second metal particle aggregate formation process. FIG. 2F shows a bonding process.

First, as shown in FIG. 2A, a paste in which metal particles 16 and metal particles 17 are mixed with a flux is supplied to the electrode pads 8 of the interposer 2 by screen printing. The metal particles 16 are, for example, copper particles. The metal particles 17 are, for example, tin particles. A plurality of semiconductor elements 1 are mounted on the interposer 2, and the semiconductor elements 1 and the surface 2b on which the semiconductor elements 1 are mounted are sealed by the sealing resin 7.

Next, as shown in FIG. 2B, the interposer 2 to which the paste including the metal particles 16 and the metal particles 17 is supplied is heated by a heating method such as reflow to diffuse the metal particles 16 and 17 together, so that the metal particle aggregate 10 having a melting point higher than that of the solder material 11 is formed. In the heating, the metal particles 16 do not melt. However, the metal particles 16 are metal-bonded together at interfaces between the metal particles 16 by metal diffusion, so that the metal particle aggregate 10 is formed. For example, when the metal particles 16 that are copper particles and the metal particles 17 that are tin particles are heated, alloy particles of copper and tin are formed by metal diffusion and the alloy particles are bonded together, so that the metal particle aggregate 10 is formed.

The paste may be supplied by a method other than the printing, such as dispensing. The heating method may be a spot heating method or the like if the temperature can be raised to a temperature at which the metals are diffused.

As a result, even when the metal particle aggregate 10 is heated to the melting point of the solder material 11 by heating thereafter, the metal particle aggregate 10 can maintain the aggregate state of the particles. The metal particle aggregate 10 does not become spherical by surface tension, but holds a shape near the shape formed when the metal particles are transferred to the electrode pads 8 of the interposer 2 by screen printing.

After the heating, the metal particle aggregate 10 including voids is formed. As shown in FIG. 2C, solder balls 110 formed by the solder material 11 are placed on the metal particle aggregates 10 and reflow heating is performed. Here, the paste including the metal particles 16 and the metal particles 17 is desired to have a flat surface by the screen printing so that the solder ball 110 can be easily placed.

The solder ball 110 mounted on the metal particle aggregate 10 is melted by the reflow heating and the melted solder material 11 infiltrates into the voids in the metal particle aggregate 10. Thereby, the metal layer 50 in which the voids in the metal particle aggregate 10 are filled with the solder material 11 is formed.

In order to infiltrate the solder material 11 into the voids in the metal particle aggregate 10, the metal particle aggregate 10 may be an alloy that is wettable with the melted solder material 11. For example, an alloy of copper and tin is good to be used. Thereafter, the interposer 2 and the sealing resin 7 are cut at cutting positions 120 and divided into chips, so that the semiconductor devices 4 are manufactured.

On the other hand, regarding the printed wiring board 3, in the same manner, as shown in FIG. 2D, a paste in which the metal particles 16 and the metal particles 17 are mixed with a flux is supplied to the electrode pads 9 of the printed wiring board 3 by screen printing. Then, as shown in FIG. 2E, in the same manner as in the case of forming the metal particle aggregates 10 on the interposer 2, the metal particle aggregates 10 are formed by reflow heating or the like. The formed metal particle aggregates 10 have a structure including voids.

Next, as shown in FIG. 2F, the surface 2a of the interposer 2 and the surface 3a of the printed wiring board 3 are faced each other and the solder balls 110 bonded to the metal particle aggregates 10 on the interposer 2 are placed on the metal particle aggregates 10 on the printed wiring board 3. Then, the semiconductor device 4 and the printed wiring board 3 are heated by reflow, so that the solder material 11 is infiltrated into the metal particle aggregates 10 provided on the printed wiring board 3.

Thereby, the solder material 11 fills the voids in the metal particle aggregate 10, so that the joint materials 70 shown in FIG. 1A in which the metal layers 50 and the solder layer 60 are stacked are formed and the semiconductor device 4 and the printed wiring board 3 are bonded together.

According to the configuration described above, the joint material 70 has a stacked structure of the solder layer 60 and the metal layers 50 and 50, and each of the metal layers 50 and 50 functions as a pedestal that heightens the solder. The metal layer 50 is formed by filling the melted solder material 11 into the voids in the metal particle aggregate 10. Therefore, in the interface portion between the solder layer 60 formed by the solder material 11 and the metal layer 50 into which the solder material 11 infiltrates, there is no portion in which the physical property of materials drastically changes. Thereby, it is possible to prevent a shear load from being concentrated to the interface portion between the solder layer 60 and the metal layers 50 and 50, so that the strain generated in the solder material 11 can be alleviated.

Further, the solder material 11 that absorbs the shear load is flowed into the voids in the metal particle aggregate 10, so that the solder material 11 infiltrates to the electrode pads 8 and 9 and the height of the solder in the joint material 70 is higher than the height of the solder 60 itself. In other words, not only the solder layer 60, but also the solder material 11 filled into the voids in the metal particle aggregate 10 absorbs the shear load, so that the strain generated in the solder material 11 can be efficiently alleviated. Thereby, it is possible to ensure the height of the joint material 70 and improve the reliability of the joint material 70.

Since it is possible to ensure the height of the joint material 70 and improve the reliability of the joint material 70, the distance between the electrode pads 8 (that is, the distance between the joint materials 70) can be small, so that the area of the interposer 2, that is the area of the semiconductor device 4, can be reduced.

The melting point of the metal particle aggregate 10 is higher than that of the solder material 11, so that when the solder material 11 is melted and a joint structure of the solder material 60 and the metal particle aggregate 10 is formed, the shape of the metal particle aggregate 10 is not deformed. Therefore, it is possible to heighten the height of the joint material 70. Further, even after the solder material 11 is melted, the metal particles are not dispersed in the solder material 11. Therefore, the strain due to a load such as temperature change can be effectively alleviated.

Second Embodiment

Figure 3A:
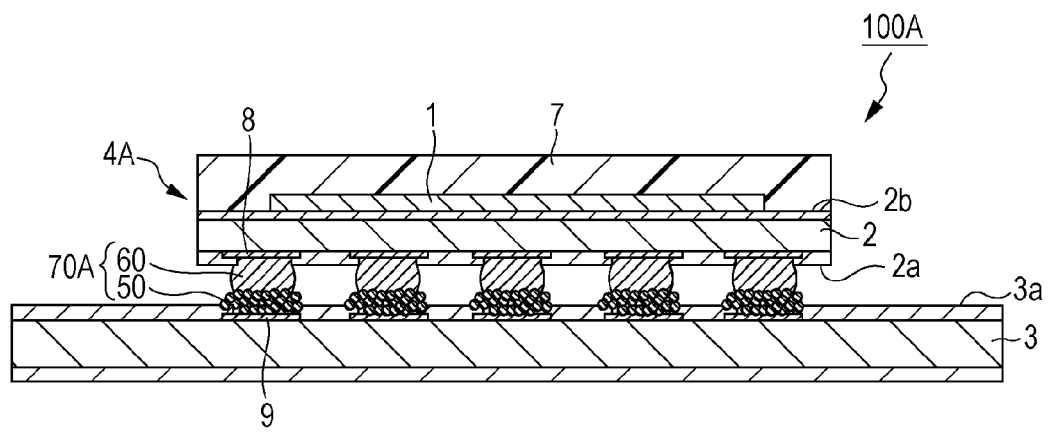
FIG. 3A is an illustration showing a schematic configuration of a printed circuit board according to a second embodiment.
Figure 3B:
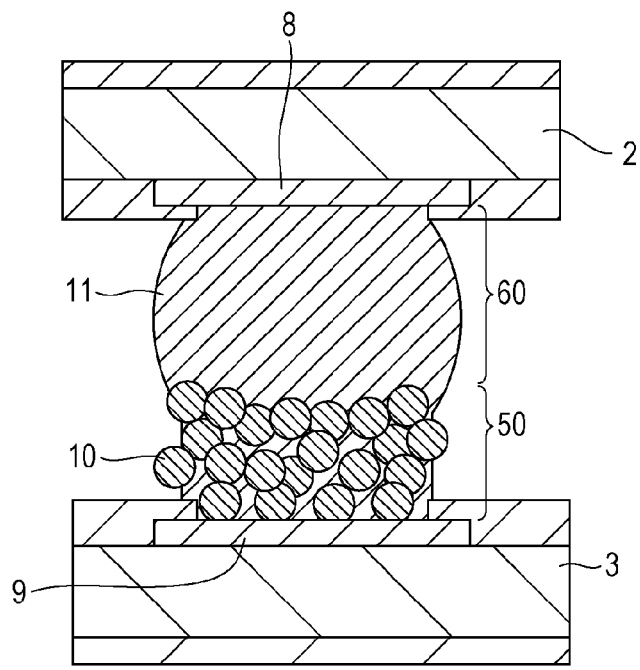
FIG. 3B is an illustration showing a schematic configuration of the printed circuit board according to the second embodiment.

Next, a printed circuit board to which a joint material according to a second embodiment of the present invention is applied will be described. FIGS. 3A and 3B are illustrations showing a schematic configuration of the printed circuit board according to the second embodiment of the present invention. FIG. 3A is a schematic cross-sectional view of the entire printed circuit board. FIG. 3B is a partial enlarged view of a bonding portion. The same components as those in the embodiment described above are given the same reference numerals and the descriptions thereof will be omitted.

In the first embodiment, a case is described in which the metal particle aggregate 10 is provided to the electrode pad 8 of the interposer 2 and the electrode pad 9 of the printed wiring board (mother board) 3 to form the metal layers 50. The metal layer 50 may be formed on at least one of the electrode pad 8 of the interposer 2 and the electrode pad 9 of the printed wiring board (mother board) 3, so that, in the second embodiment, a case of forming the metal layer 50 on the electrode pad 9 will be described.

As shown in FIG. 3A, a printed circuit board 100A includes the interposer 2 of the semiconductor device 4A and the printed wiring board 3, which are bonded together by a joint material 70A. As shown in FIG. 3B, the joint material 70A includes the metal layer 50 having the metal particle aggregate 10 formed on the electrode pads 9 of the printed wiring board 3 and the solder layer 60 formed by the solder material 11. In short, the joint material 70A has a structure in which the metal layer 50 and the solder layer 60 are stacked.

The solder material 11 of the solder layer 60 is bonded to the electrode pad 8 of the interposer 2. When the solder material 11 is melted, the solder material 11 infiltrates into the voids in the metal particle aggregate 10, and then solidifies and fills the voids. Thereby, the metal layer 50 and the solder layer 60 are bonded together. The solder material 11 that flows into the voids in the metal particle aggregate 10 reaches the electrode pad 9, so that the solder material 11 is bonded to the electrode pad 9. The electrode pad 8 of the interposer 2 and the electrode pad 9 of the printed wiring board 3 are bonded together by the joint material 70A having the configuration described above.

In the second embodiment, the metal layer 50 including the metal particle aggregates 10 is formed on the electrode pad 9 of the printed wiring board 3. However, the metal layer 50 may be formed on the electrode pad 8 of the interposer 2.

Figure 4A:
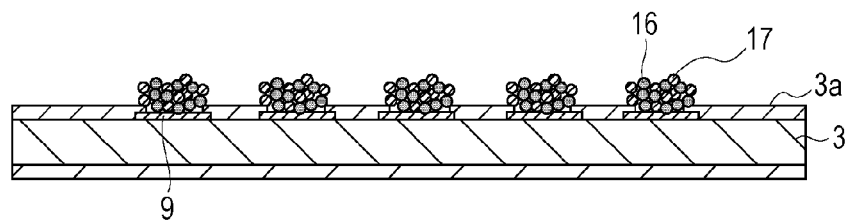
FIG. 4A is a schematic diagram for explaining a process of bonding together a printed wiring board and a semiconductor device.
Figure 4B:
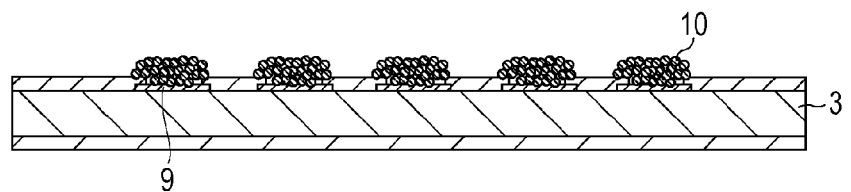
FIG. 4B is a schematic diagram for explaining a process of bonding together the printed wiring board and the semiconductor device.
Figure 4C:
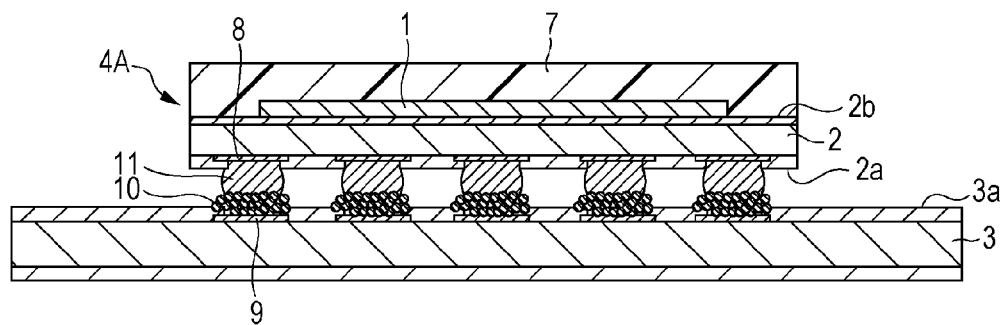
FIG. 4C is a schematic diagram for explaining a process of bonding together the printed wiring board and the semiconductor device.

Next, a manufacturing method of the printed circuit board 100A of the second embodiment will be described with reference to FIGS. 4A to 4C. FIGS. 4A to 4C are schematic diagrams for explaining processes of bonding together the printed wiring board 3 and the semiconductor device 4A. FIG. 4A shows a metal particle supply process. FIG. 4B shows a metal particle aggregate formation process. FIG. 4C shows a bonding process. The manufacturing method of the second embodiment is a method in which the process of forming the metal particle aggregate on the interposer 2 is omitted from the manufacturing method of the first embodiment. In other words, no metal particle aggregate is formed on the interposer 2 of the semiconductor device 4A.

First, as shown in FIG. 4A, a paste including the metal particles 16 and metal particles 17 is supplied to the electrode pads 9 of the printed wiring board 3 by screen printing.

Next, as shown in FIG. 4B, the printed wiring board 3 to which the paste including the metal particles 16 and the metal particles 17 is supplied is heated by a heating method such as reflow to diffuse the metal particles 16 and 17 together, so that the metal particle aggregate 10 having a melting point higher than that of the solder material 11 is formed.

Next, as shown in FIG. 4C, the surface 2a of the interposer 2 and the surface 3a of the printed wiring board 3 are faced each other and the solder balls 110 bonded to the electrode pads 8 on the interposer 2 are placed on the metal particle aggregates 10 on the printed wiring board 3. Then, the semiconductor device 4A and the printed wiring board 3 are heated by reflow, so that the solder material 11 is infiltrated into the metal particle aggregates 10 provided on the printed wiring board 3.

Thereby, the solder material 11 fills the voids in the metal particle aggregate 10, so that the joint materials 70A shown in FIG. 3A in which the metal layer 50 and the solder layer 60 are stacked are formed and the semiconductor device 4A and the printed wiring board 3 are bonded together.

According to the second embodiment, in the same manner as in the first embodiment, it is possible to improve reliability of the joint material 70A and reduce the area of the semiconductor device 4A. Further, as compared with the first embodiment, the process of forming the metal particle aggregates on the semiconductor device is not required, so that it is possible to reduce the number of manufacturing processes.

Third Embodiment

Figure 5A:
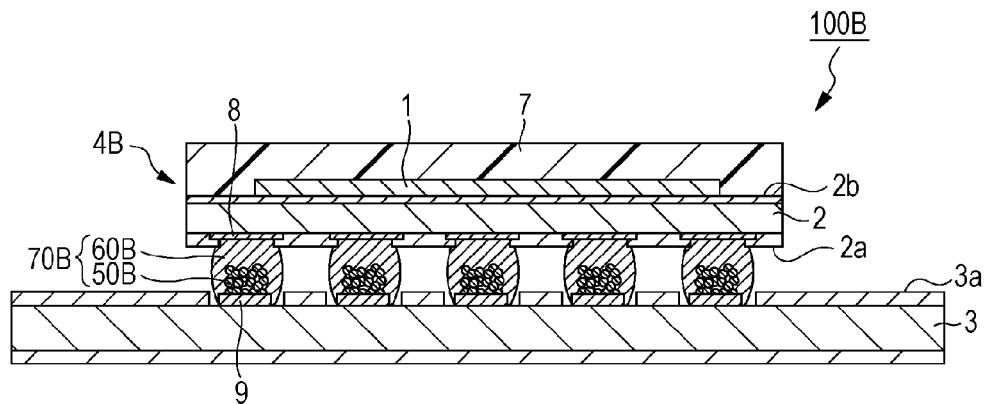
FIG. 5A is an illustration showing a schematic configuration of a printed circuit board according to a third embodiment.
Figure 5B:
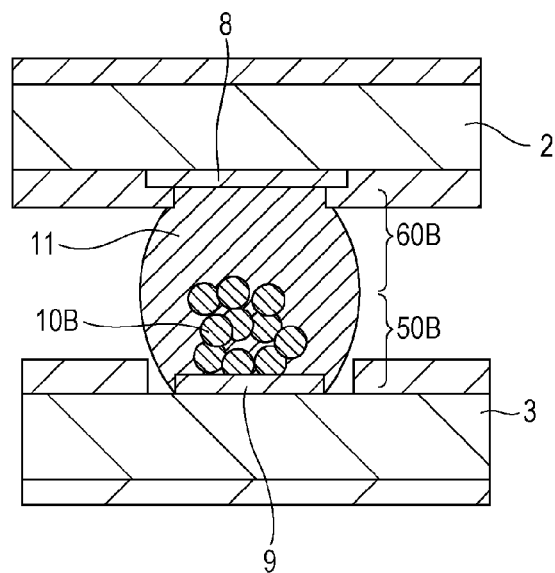
FIG. 5B is an illustration showing a schematic configuration of the printed circuit board according to the third embodiment.

Next, a printed circuit board to which a joint material according to a third embodiment of the present invention is applied will be described. FIGS. 5A and 5B are illustrations showing a schematic configuration of the printed circuit board according to the third embodiment of the present invention. FIG. 5A is a schematic cross-sectional view showing the entire printed circuit board. FIG. 5B is a partial enlarged view of a bonding portion. The same components as those in the embodiments described above are given the same reference numerals and the descriptions thereof will be omitted.

As shown in FIG. 5A, a printed circuit board 100B includes the interposer 2 of the semiconductor device 4B and the printed wiring board 3, which are bonded together by a joint material 70B. As shown in FIG. 5B, the joint material 70B includes a metal layer 50B having a porous metal particle aggregate 10B formed on the electrode pads 9 of the printed wiring board 3 and a solder layer 60B formed by the solder material 11. In short, the joint material 70B has a structure in which the metal layer 50B and the solder layer 60B are stacked.

Many voids are formed in the metal particle aggregate 10B and the solder material 11 flows into the voids. The solder material 11 of the solder layer 60B is bonded to the electrode pad 8 of the interposer 2. When the solder material 11 is melted, the solder material 11 infiltrates into the voids in the metal particle aggregate 10B, fills the voids, and covers the outer surface of the metal particle aggregate 10B. Thereby, the metal layer 50B and the solder layer 60B are bonded together. The solder material 11 that flows into the voids in the metal particle aggregate 10B reaches the electrode pad 9, so that the solder material 11 is bonded to the electrode pad 9. The solder material 11 that covers the outer surface of the metal particle aggregate 10B reaches the electrode pad 9, so that the solder material 11 is bonded to the electrode pad 9. The electrode pad 8 of the interposer 2 and the electrode pad 9 of the printed wiring board 3 are bonded together by the joint material 70B having the configuration described above.

In the third embodiment, the metal layer 50B including the metal particle aggregate 10B is formed on the electrode pad 8 of the interposer 2. However, the metal layer 50B may be formed on the electrode pad 9 of the printed wiring board 3 or may be formed on both electrode pads 8 and 9.

Although the electrode pad 9 of the printed wiring board 3 is NSMD (Non Solder Mask Defined), the electrode pad 9 may be SMD (Solder Mask Defined).

Figure 6A:
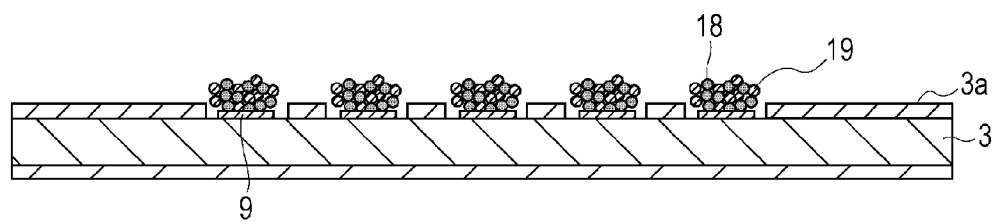
FIG. 6A is a schematic diagram for explaining a process of bonding together a printed wiring board and a semiconductor device.
Figure 6B:
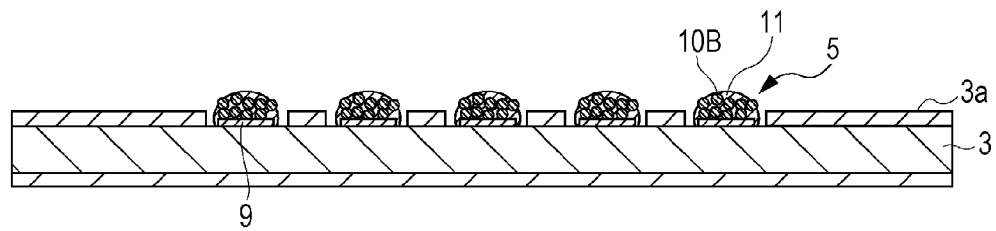
FIG. 6B is a schematic diagram for explaining a process of bonding together the printed wiring board and the semiconductor device.
Figure 6C:
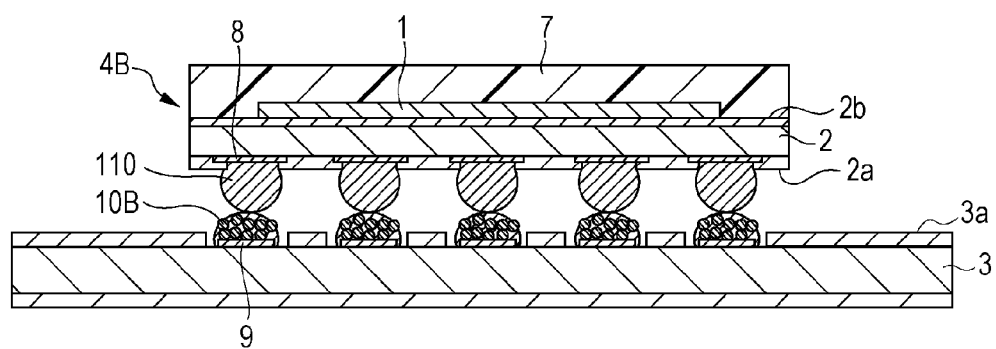
FIG. 6C is a schematic diagram for explaining a process of bonding together the printed wiring board and the semiconductor device.

Next, a manufacturing method of the printed circuit board 100B of the third embodiment will be described with reference to FIGS. 6A to 6C. The outer surface of the metal particle aggregate may be covered by a solder material in the final bonding process in the same manufacturing method as that of the first embodiment and the second embodiment. However, in the third embodiment, another manufacturing method will be described. FIGS. 6A to 6C are schematic diagrams for explaining processes of bonding together the printed wiring board 3 and the semiconductor device 4B. FIG. 6A shows a metal particle supply process. FIG. 6B shows a metal particle aggregate formation process. FIG. 6C shows a bonding process.

First, as shown in FIG. 6A, a paste in which metal particles 18 and solder powder 19 are mixed with a flux is supplied to the electrode pads 9 of the printed wiring board 3 by screen printing. Different from a generally used solder paste, the metal particles 18, which are not melted by heating such as reflow heating, are mixed in addition to the solder powder 19 and the flux. The metal particles 18 may be material having good wettability to the solder and having a melting point higher than that of the solder. Copper (Cu) can be used as the metal particles 18.

Next, as shown in FIG. 6B, the paste provided to the electrode pads 9 on the printed wiring board 3 is heated by reflow heating or the like, so that the metal particle aggregate 10B is formed and a structure 5 in which the voids in the metal particle aggregate 10B are filled with the solder material 11 is formed. At the same time, the metal particle aggregate 10B is covered by the solder material 11.

In other words, the voids in the metal particle aggregate 10B are filled with the solder material 11 by the reflow heating and at the same time the solder material 11 melted by the reflow heating covers the metal particle aggregate 10B.

Next, as shown in FIG. 6C, the surface 2a of the interposer 2 and the surface 3a of the printed wiring board 3 are faced each other and the solder balls 110 bonded to the electrode pads 8 on the interposer 2 are placed on the structures 5 including the metal particle aggregates 10B on the printed wiring board 3. Then, the semiconductor device 4B and the printed wiring board 3 are heated by reflow, so that the joint materials 70B shown in FIG. 5A in which the metal layer 50B and the solder layer 60B are bonded together are formed and the semiconductor device 4B and the printed wiring board 3 are bonded together.

According to the third embodiment, in the metal layer 50B of the joint material 70B, the voids in the metal particle aggregate 10B are filled with the solder material 11 and the outer surface of the metal particle aggregate 10B is covered by the solder material 11. Thereby, the height is ensured by the volume of the structure in which the voids in the metal particle aggregate 10B are filled with the solder material 11. Further, the strain can be distributed to near the interface between the metal particle aggregate 10B and the solder material 11 and to near the interface between the solder material 11 and the electrode pad 9, so that the strain generated in the joint material 70B can be further reduced.

Fourth Embodiment

Figure 7:
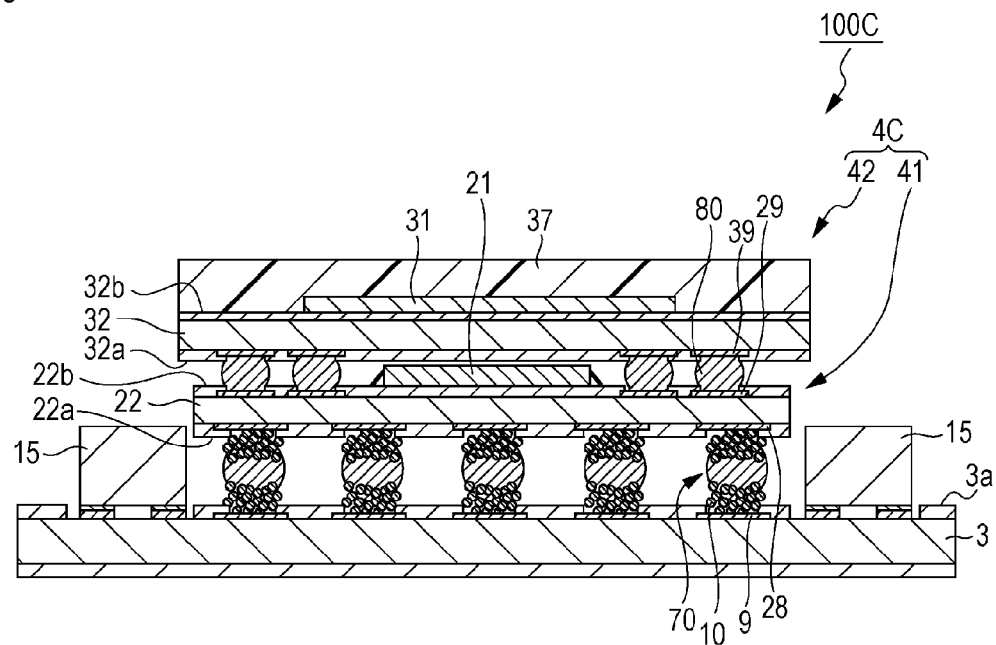
FIG. 7 is an illustration showing a schematic configuration of a printed circuit board according to a fourth embodiment.

Next, a printed circuit board to which a joint material according to a fourth embodiment of the present invention is applied will be described. FIG. 7 is an illustration showing a schematic configuration of the printed circuit board according to the fourth embodiment of the present invention. The same components as those in the embodiments described above are given the same reference numerals and the descriptions thereof will be omitted.

As shown in FIG. 7, a printed circuit board 100C includes a stacked type semiconductor device 4C and the printed wiring board 3, which are bonded together. The stacked type semiconductor device 4C is formed by stacking a plurality of semiconductor packages. In the fourth embodiment, the stacked type semiconductor device 4C is formed by stacking a second semiconductor package 42 on a first semiconductor package 41.

The first semiconductor package 41 includes a first semiconductor element 21 and a first interposer 22 which is a wiring substrate on which the first semiconductor element 21 is mounted. The second semiconductor package 42 includes a second semiconductor element 31 and a second interposer 32 which is a wiring substrate on which the second semiconductor element 31 is mounted.

One surface (one side) 3a of the printed wiring board 3 and one surface (one side) 22a of the first interposer 22 face each other. The other surface 22b of the first interposer 22 and one surface 32a of the second interposer 32 face each other.

On the one surface 22a of the first interposer 22, a plurality of electrode pads 28 for electrically connecting to each of the electrode pads 9 on the printed wiring board 3 are formed with a distance from each other. For example, the electrode pads 28 are arranged at an equal interval in an array form. The electrode pads 9 on the printed wiring board 3 are also arranged at an equal interval in an array form so that the electrode pads 9 face the electrode pads 28.

The first semiconductor element 21 is mounted on the other surface 22b of the first interposer 22. Further, on the surface 22b of the first interposer 22, a plurality of electrode pads 29 are formed with a distance from each other in positions other than the position of the first semiconductor element 21. For example, the electrode pads 29 are arranged at an equal interval in an array form in positions other than the position of the first semiconductor element 21.

On the one surface 32a of the second interposer 32, a plurality of electrode pads 39 for electrically connecting to each of the electrode pads 29 on the first interposer 22 are formed with a distance from each other. Each electrode pad 39 is arranged to face an electrode pad 29. For example, the electrode pads 39 are arranged at an equal interval in an array form. The second semiconductor element 31 is mounted on the other surface 32b of the second interposer 32 and sealed along with the surface 32b by a sealing resin 37.

The electrode pad 29 formed on the surface 22b of the first interposer 22 and the electrode pad 39 formed on the surface 32a of the second interposer 32 are bonded together by a solder ball 80 formed by solder material.

In the fourth embodiment, the electrode pad 28 formed on the surface 22*a* of the first interposer 22 and the electrode pad 9 formed on the surface 3*a* of the printed wiring board 3 are bonded together by the joint material 70 having the same configuration as that of the first embodiment. In the fourth embodiment, one of the first interposer 22 and the printed wiring board 3 is the first wiring substrate on which the first electrode pads are formed and the other is the second wiring substrate on which the second electrode pads are formed.

An electronic component 15 such as a chip capacitor is disposed around the stacked type semiconductor device 4C and the electronic component 15 is mounted on the printed wiring board 3.

According to the fourth embodiment, in the same manner as in the first embodiment, the electrode pads 9 and 28 are bonded together by using the joint material 70 whose bonding reliability is improved by heightening the joint material 70 by the metal particle aggregate 10, so that the electrode pads 28 can be arranged at a small interval. Therefore, the size of the second semiconductor package 42 or the sizes of both semiconductor packages 41 and 42 can be reduced. Thereby, the electronic component 15 can be disposed without interfering with the second semiconductor package 42 in a space around the first semiconductor package 41, so that there is an effect that the printed wiring board 3 can be effectively used.

Fifth Embodiment

Figure 8:
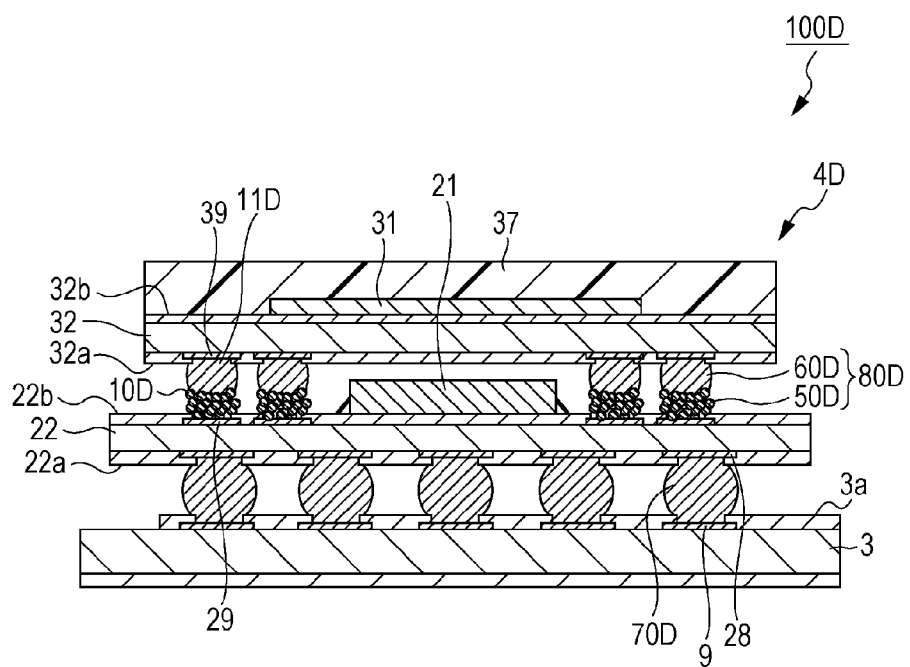
FIG. 8 is an illustration showing a schematic configuration of a printed circuit board according to a fifth embodiment.

Next, a printed circuit board to which a joint material according to a fifth embodiment of the present invention is applied will be described. In the first to the fourth embodiments, a case is described in which a joint material is used to bond the interposer and the printed wiring board together. However, in the fifth embodiment, a case will be described in which a joint material is used to bond interposers together in a stacked type semiconductor device. FIG. 8 is an illustration showing a schematic configuration of the printed circuit board according to the fifth embodiment of the present invention. The same components as those in the embodiments described above are given the same reference numerals and the descriptions thereof will be omitted.

As shown in FIG. 8, a printed circuit board 100D includes a stacked type semiconductor device 4D mounted on a printed wiring board (mother board) 3 by a solder ball 70D. The stacked type semiconductor device 4D is formed by stacking a plurality of (two in the fifth embodiment) semiconductor packages.

In the fifth embodiment, one surface 22*b* of the first interposer 22, which is a wiring substrate of the semiconductor device 4D, and one surface 32*a* of the second interposer 32, which is a wiring substrate, are arranged to face each other. The first electrode pad 29 formed on the surface 22*b* of the first interposer 22 and the second electrode pad 39 formed on the surface 32*a* of the second interposer 32 are bonded together by a joint material 80D.

The joint material 80D is formed by stacking a solder layer 60D formed by a solder material 11D and a metal layer 50D formed on at least one of the electrode pads 29 and 39 (electrode pad 29 in the fifth embodiment). The metal layer 50D includes a metal particle aggregate 10D in which a plurality of metal particles are integrated with voids.

The solder material 11D of the solder layer 60D is bonded to the electrode pad 39. When the solder material 11D is melted, the solder material 11D infiltrates into the voids in the metal particle aggregate 10D and fills the voids. Thereby, the metal layer 50D and the solder layer 60D are bonded together.

The solder material 11D that flows into the voids in the metal particle aggregate 10D reaches the electrode pad 29, so that the solder material 11D is bonded to the electrode pad 29. The electrode pad 29 of the first interposer 22 and the electrode pad 39 of the second interposer 32 are bonded together by the joint material 80D having the configuration described above. In this way, the joint material 80D formed by the metal layer 50D and the solder layer 60D is used as a joint structure of the electrode pad 29 of the first interposer 22 and the electrode pad 39 of the second interposer 32 in the stacked type semiconductor device 4D.

According to the fifth embodiment, the metal particle aggregate 10D of the metal layer 50D functions as a pedestal of the solder material 11D, so that even when a small solder ball is used, the height can be increased.

Therefore, it is not necessary to reduce the thickness of the semiconductor element 21 located between the interposers 22 and 32, so that the strength of the semiconductor element 21 can be maintained. Since the strength of the semiconductor element 21 is maintained, in a manufacturing process for mounting the semiconductor element 21 on the interposer 22, the semiconductor element 21 can be handled easily and the yield rate is improved.

The porous metal particle aggregate 10D including voids is used and the melted solder material 11D fills the voids, so that the solder layer 60D and the metal layer 50D are bonded together. Therefore, it is possible to prevent a shear load from being concentrated to the interface portion by distributing the load to the solder material 11D filling the voids in the metal particle aggregate 10D, so that the strain generated in the solder material 11D can be alleviated.

In this way, an external connection terminal connected to the second interposer 32 is the joint material 80D, so that the joint materials 80D can be arranged at a small interval. Therefore, it is possible to reduce the area of the interposer 32 while ensuring bonding reliability of the semiconductor device 4D, so that the semiconductor device 4D can be downsized.

Figure 9:
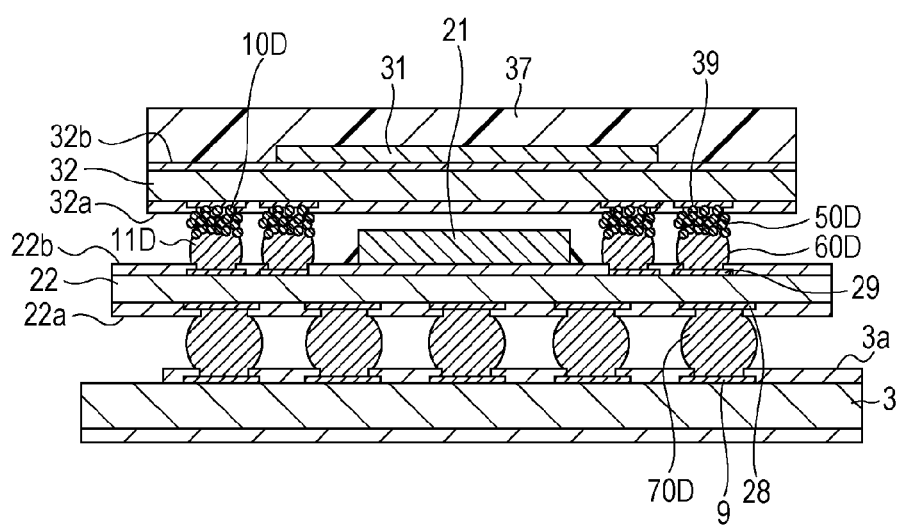
FIG. 9 is an illustration showing a schematic configuration of a printed circuit board according to a sixth embodiment.

In the fifth embodiment, a case is described in which the metal layer 50D is provided on the electrode pad 29 of the first interposer 22 and the solder layer 60D is provided on the electrode pad 39 of the second interposer 32 in the same manner as in the second embodiment. However, it is not limited to this. As shown in FIG. 9, the joint material may be formed by providing the solder layer 60D on the electrode pad 29 of the first interposer 22 and the metal layer 50D on the electrode pad 39 of the second interposer 32. Although not shown in the drawings, the joint material may have a stacked structure of a metal layer, a solder layer, and a metal layer by providing a metal layer including a metal particle aggregate on both electrode pads 29 and 39. The metal particle aggregate may be covered by the solder material in the same manner as in the third embodiment.

The joint materials of the first to the fourth embodiment may be used to bond together the interposer 22 of the semiconductor device 4D and the printed wiring board 3, so that the area of the semiconductor device 4D can be further reduced.

Although the stacked type semiconductor device 4D has a two-layer structure in the fifth embodiment, the fifth embodiment can be applied to a stacked type semiconductor device having three or more layers. In this case, the joint material 80D can be also used to bond the interposers together.

EXAMPLES

Example 1

In EXAMPLE 1, thermal deformation of the semiconductor device 4 and the printed wiring board 3 during a reliability test is measured in the configuration of the first embodiment shown in FIGS. 1A and 1B, and the strain generated when the joint material 70 is used in the reliability test is calculated by simulation. Specific dimensions are described below.

A sample is obtained by mounting a semiconductor element 1 having a square shape 9 mm on a side on the interposer 2 having a square shape 17 mm on a side and a thickness of 0.46 mm. Solder resist (SR) openings having a diameter of 200 micrometers, on which solder can be arranged at an interval of 0.4 mm, are formed on a surface 2a opposite to the surface 2b on which the semiconductor element 1 is mounted. Solder balls 110 having a diameter of 240 micrometers are used. The thickness of the printed wiring board 3 is 0.8 mm.

The metal layer 50 in which the voids in the metal particle aggregates 10 are filled with the solder material 11 is formed on the electrode pad 8 of the interposer 2 and the electrode pad 9 of the printed wiring board 3. The height of the solder layer 60 is 143 micrometers. The semiconductor device 4 and the printed wiring board 3 are bonded together through the joint material 70.

The thermal deformation of the interposer 2 of the semiconductor device 4 at a temperature under an environment of a test performed in the reliability test is measured. Regarding the temperature condition of the reliability test, a high temperature is 125 degrees Celsius and a low temperature is −25 degrees Celsius. Regarding the thermal deformation, the amount of thermal deformation of the upper surface 2b of the interposer 2 of the semiconductor device 4 is measured at the high temperature and the low temperature and the amount of thermal deformation of a surface of the printed wiring board 3 opposite to the surface 3a on which the semiconductor device 4 is mounted is measured at the high temperature and the low temperature. In this measurement, a DE type standard chamber made by Mita Sangyo Co., Ltd. is used for heating and cooling and ARAMIS v6 made by GOM mbH is used to calculate the deformation. As a result of the measurement, there is a difference of the thermal deformation of 6.5 micrometers in the horizontal direction and 6.8 micrometers in the vertical direction at a point at which the difference of the thermal deformation between the interposer 2 of the semiconductor device 4 and the printed wiring board 3 is largest.

When the strain generated in the joint material 70 shown in FIG. 1A is calculated by ABAQUS v6.7 using the above measurement result, the strain value is 1.10%.

Next, evaluation is performed by using an experimental result described in a document of Qiang Yu, Masaki Shiratori "Effects of BGA Solder Geometry on Fatigue Life and Reliability Assessment" Journal of Japan Institute of Electronics Packaging 1 [4] 278-283 (1998) (hereinafter simply referred to as a document). In this document, an experimental result indicating a relationship between the shape of solder bonding portion and the number of cycles by which a crack occurs. According to the document, it is known that the strain value of 1.10% means a bonding life corresponding to 829 cycles.

As a comparative example, the sample of EXAMPLE 1 is compared with strain values of a sample bonded to a printed wiring board by solder resist (SR) openings having a diameter of 300 micrometers and solder balls having a diameter of 330 micrometers which can be arranged at an interval of 0.5 mm. The height of the bonding portion between the semiconductor device and the printed wiring board is 187 micrometers. When comparing with the sample of the EXAMPLE 1, only the joint structure is different and the other configurations and dimensions are the same. The thermal deformation is measured at the high temperature of 125 degrees Celsius and the low temperature of −25 degrees Celsius in the reliability test, and then the strain is calculated. As a result, the strain is 1.20%. According to the document described above, it is known that the strain value of 1.20% means a bonding life corresponding to 697 cycles.

In this way, an effect of reliability of the solder balls arranged at an interval of 0.5 mm as external connection terminals as an comparative example and an effect of reliability of the joint materials 70, in which the solder layer 60 and the metal layers 50 and 50 including the metal particle aggregate are stacked, of EXAMPLE 1 are compared. As a result, it is confirmed that when the joint materials 70 in which the solder layer 60 and the metal layers 50 and 50 are stacked are formed at an interval of 0.4 mm, the reliability is improved.

This is because the solder layer 60 that absorbs the shear stress is bonded to the metal layers 50 and 50 in which solder fills the voids in the metal particle aggregate 10, so that there is no portion in which the physical property of materials drastically changes. Also, this is because the solder that fills the voids in the metal particle aggregate 10 absorbs a load, so that the generated strain is reduced. In other words, this is because the same effect as that obtained when the height of the solder which is the softest is formed to be high can be obtained by stacking the solder layer 60 and the metal layers 50 and 50.

Thereby, even when the joint materials 70 are arranged at an interval of 0.4 mm, the reliability is improved, so that the area of the semiconductor device 4 can be reduced. Conventionally, when external connection terminals are formed at an interval of 0.5 mm on the entire surface of an interposer having a square shape 17 mm on a side, 1024 terminals can be formed. On the other hand, when EXAMPLE 1 is applied, if the external connection terminals are formed at an interval of 0.4 mm, a sufficient reliability can be ensured, so that the external size of the interposer necessary to form the same 1024 terminals can be reduced to a square shape 13.8 mm on a side. Thereby, the mounting area of the wiring board can be reduced by more than 30%, so that the area of the semiconductor device 4 can be reduced while ensuring the reliability.

Figure 10:
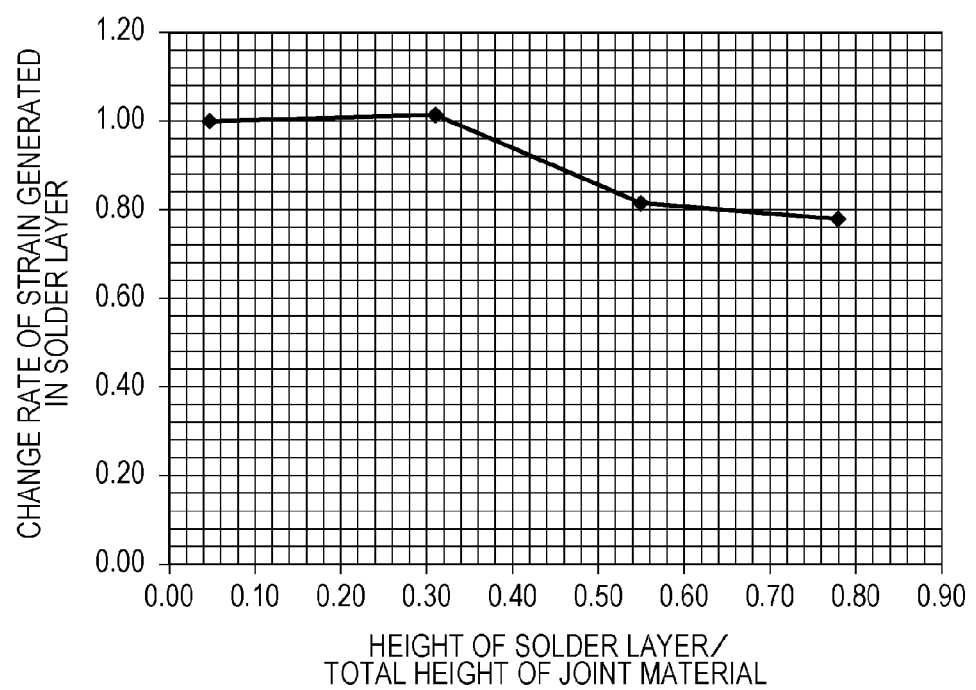
FIG. 10 is a graph showing a change rate of strain generated in a joint material in EXAMPLE 1.

FIG. 10 is a graph showing a change rate of the strain generated in the solder layer 60 according to a ratio of the height of the solder layer 60 to the total height of the joint material 70. The horizontal axis represents the ratio of the height of the solder layer 60 to the total height of the joint material 70 and the vertical axis represents the change rate of the generated strain.

According to FIG. 10, when the height of the solder layer 60/the total height of the joint material 70 is 0.55 or more, the strain generated in the solder layer 60 decreases. This is because when the height of the solder layer 60 is low, the solder layer 60 is difficult to be deformed, so that base material of the interposer 2, copper electrodes, and the like start to be deformed. Therefore, the strain concentrates on the interface between the copper electrode on which the solder layer 60 is formed and the solder layer 60. Therefore, to obtain an effect of alleviating the strain generated in the metal layer 50 including the metal particle aggregate 10, the height of the solder layer 60/the diameter of the metal particle aggregate 10 may be at least 0.55. Thereby, there is a significant effect that the solder layer 60 absorbs the shear stress and the metal layers 50 and 50 alleviate the strain generated in the solder layer 60.

Example 2

In EXAMPLE 2, in the same manner as in EXAMPLE 1, the thermal deformation of the semiconductor device 4A and the printed wiring board 3 during a reliability test is measured in the configuration of the second embodiment shown in FIGS. 3A and 3B, and the strain generated in the joint material 70A at that time is calculated.

A sample is obtained by mounting a semiconductor element 1 having a square shape 9 mm on a side on the interposer 2 having a square shape 17 mm on a side and a thickness of 0.46 mm. Solder resist (SR) openings having a diameter of 200 micrometers, on which solder can be arranged at an interval of 0.4 mm, are formed on a surface 2a opposite to the surface 2b on which the semiconductor element 1 is mounted. Solder balls having a diameter of 250 micrometers are used. The thickness of the printed wiring board 3 is 0.8 mm. At this time, the height of the solder layer 60 is 157 micrometers. The semiconductor device 4A and the printed wiring board 3 are bonded together through the joint material 70A. The measurement method of the thermal deformation of the interposer 2 of the semiconductor device 4A and the printed wiring board 3 and the calculation method of the strain generated in the joint structure are the same as those in EXAMPLE 1.

When the strain is calculated, the stacked joint material 70A has a strain value of 1.19%, and according to the above document, the number of cycles by which a crack occurs in the joint material 70A in which the metal layer 50 and the solder layer 60 are stacked corresponds to 709 cycles.

As described above, the joint material 70A of EXAMPLE 2 has a larger effect of alleviating the strain generated in the solder layer 60 than the solder ball arranged at an interval of 0.5 mm as an external connection terminal of the comparative example. Therefore, the area of the semiconductor device 4A can be reduced while ensuring the reliability of the joint material 70A. Further, as compared with EXAMPLE 1, the process of forming the metal particle aggregates on the semiconductor device is not required, so that it is possible to reduce the number of manufacturing processes.

Figure 11:
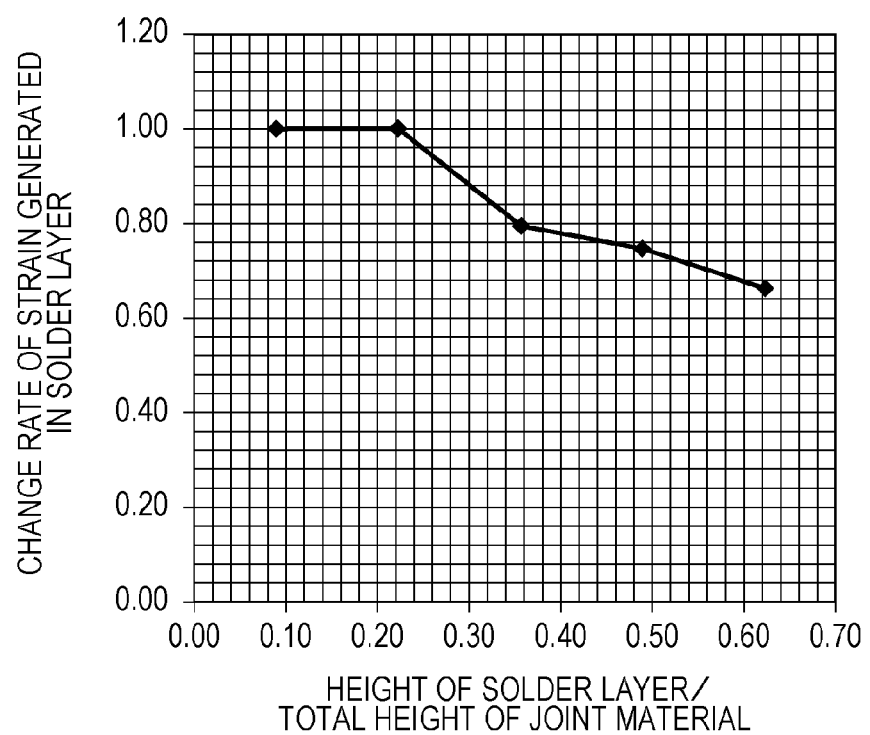
FIG. 11 is a graph showing a change rate of strain generated in a joint material in EXAMPLE 2.

FIG. 11 is a graph showing a change rate of the strain generated in the solder layer 60 according to a ratio of the height of the solder layer 60 to the total height of the joint material 70A. The horizontal axis represents the ratio of the height of the solder layer 60 to the total height of the joint material 70A and the vertical axis represents the change rate of the generated strain.

According to FIG. 11, when a ratio of the height of the solder layer 60 to the total height of the joint material 70A is 0.36 or more, the strain generated in the solder layer 60 decreases. This is because as the height of the solder layer 60 decreases, the rigidity of the solder layer 60 increases, so that base material of the interposer 2, copper electrodes, and the like start to be deformed. As a result, the strain concentrates on the interface between the copper electrode on which the solder layer 60 is formed and the solder layer 60.

Therefore, to obtain an effect that the metal layer 50 alleviates the strain generated in the solder layer 60, if the height of the solder layer 60/the diameter of the metal particle aggregate 10 is at least 0.36, the solder layer absorbs the shear stress, so that, in particular, the effect of alleviating the strain generated in the solder layer is large. Therefore, the area of the semiconductor device 4A can be reduced while ensuring the reliability of the joint material 70A.

Example 3

In EXAMPLE 3, in the configuration of the third embodiment shown in FIGS. 5A and 5B, the thermal deformation of the semiconductor device 4B and the printed wiring board 3 during a reliability test is measured and the strain generated in the joint structure at that time is calculated. The semiconductor device 4B and the printed wiring board 3 are bonded together through solder balls having a diameter of 240 micrometers that can be arranged at an interval of 0.4 mm. The thermal deformation under a temperature cycle environment is measured and the strain value is calculated. The measurement method of the thermal deformation of the semiconductor device 4B and the printed wiring board 3 and the calculation method of the strain generated in the joint material 70B are the same as those in EXAMPLE 1.

When the strain is calculated, the stacked joint material 70B has a strain value of 1.14%, so that a sufficient effect of alleviating the strain can be also confirmed in EXAMPLE 3. According to the above document, the joint material 70B in which the solder layer 60B and the metal layer 50B are stacked corresponds to 772 cycles, so that it is confirmed that the reliability is improved.

In EXAMPLE 3, the solder material 11 fills the voids in the metal particle aggregate 10B and the solder material 11 covers the outer surface of the metal particle aggregate 10B. Thereby, when a shear stress is applied to the semiconductor device 4B and the printed wiring board 3, the solder material 11 near the electrode pads 8 and 9 and the solder material 11 near the metal particle aggregate 10B also absorb load. The entire solder provided in the joint material 70B deforms, so that the generated strain can be further alleviated. Therefore, when the voids in the metal particle aggregate 10B are filled with the solder material 11 and the metal particle aggregate 10B is covered by the solder material 11, the effect of alleviating the strain can be obtained.

Figure 12:
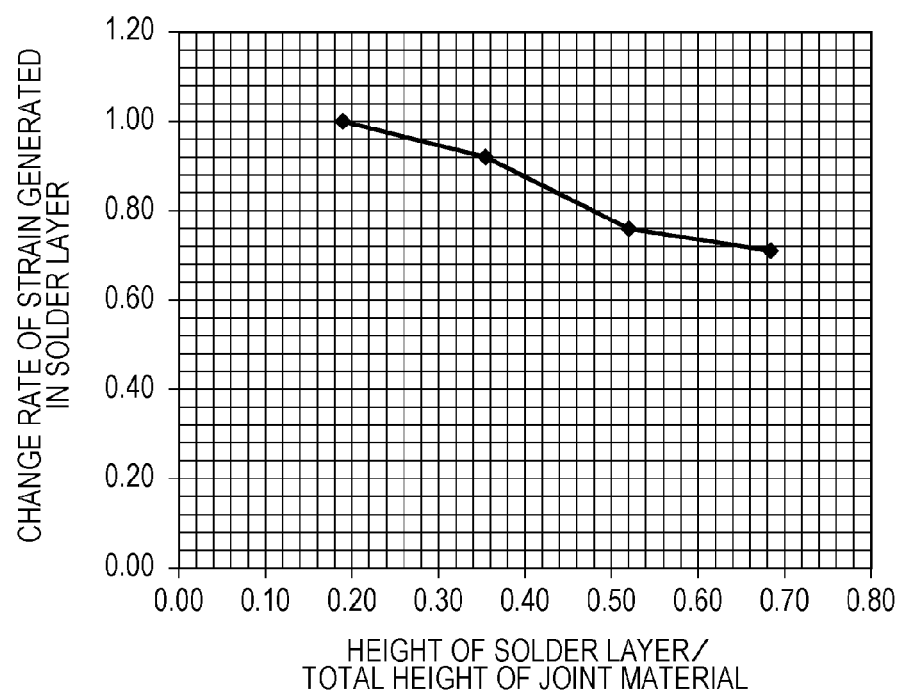
FIG. 12 is a graph showing a change rate of strain generated in a joint material in EXAMPLE 3.

FIG. 12 is a graph showing a change of the strain generated in the solder layer 60B according to a ratio of the height of the solder layer 60B to the total height of the joint material 70B. The horizontal axis represents the ratio of the height of the solder layer 60B to the total height of the joint material 70B and the vertical axis represents the change rate of the generated strain.

According to FIG. 12, when a ratio of the height of the solder layer 60B to the total height of the joint material 70B is 0.52 or more, the strain generated in the solder layer 60B decreases. This is because as the height of the solder layer 60B decreases, the rigidity of the solder layer 60B increases, so that base material of the interposer 2, copper electrodes, and the like start to be deformed in the same manner as in EXAMPLE 2. As a result, the strain concentrates on the interface between the copper electrode on which the solder layer 60B is formed and the solder layer 60B.

Therefore, to obtain an effect that the metal layer 50B alleviates the strain generated in the solder layer 60B, the height of the solder layer 60B/the diameter of the metal particle aggregate may be at least 0.52. Thereby, in particular, the effect that the solder layer 60B absorbs the shear stress and the metal layer 50B alleviates the strain generated in the solder layer 60B is significantly large. Therefore, the area of the semiconductor device 4B can be reduced while ensuring the reliability of the joint material 70B.

Example 4

In the EXAMPLE 4, in the configuration of the fifth embodiment shown in FIG. 8, a paste including metal particles is supplied to the interposer 22 by screen printing and the metal particle aggregate 10D is formed by reflow heating, and thereafter the interposer 22 and the interposer 32 are bonded together. Thereafter, the height of the joint material 80D is measured.

In the screen printing, a print opening has a square shape 210 micrometers on a side and a print thickness is 60 micrometers. The solder ball bonded to the interposer 32 has a solder resist opening having a diameter of 210 micrometers and has a ball diameter of 200 micrometers. The height of the joint material 80D is measured after the interposers 22 and 32 are bonded together. The measured result is 208 micrometers. As a comparative example, when the interposers 22 and 32 are bonded together by only solder balls, the height of the bonding portion is 173 micrometers.

As described above, the height of the joint material 80D can be heightened by bonding the solder layer 60D on the layer 50D in which the solder layer 11D fills the voids in the metal particle aggregate 10D. Thereby, even if a small solder ball is used to reduce the area of the first interposer 22, when a joint structure in which the metal layer 50D including the metal particle aggregate 10D and the solder layer 60D are stacked is used as the joint material 80D, the semiconductor element 21 need not be thinned. Therefore, it is possible to reduce the occurrence of cracking generated when the semiconductor element 21 is bonded to the interposer 22 due to the thinning of the semiconductor element 21, so that an effect of improving the yield rate can be obtained. Further, the strain generated in the joint material 80D can be alleviated, so that it is possible to improve the reliability of the joint material 80D, reduce the area of the interposer 32, and downsize the semiconductor device 4D.

The present invention is not limited to the embodiments described above and many variations can be made by a person with an ordinary skill in the art within the technical idea of the present invention.

Although, in the above embodiments, a case is described in which the electrode pads are arranged at an equal interval in an array form, the electrode pads may be arranged in any form such as a staggered arrangement. Further, the arrangement is not limited to an equal interval arrangement and the interval may vary.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-222732, filed Oct. 7, 2011 and Japanese Patent Application No. 2012-205973, filed Sep. 19, 2012, which are hereby incorporated by reference herein in their entirety.

The invention claimed is:

1. A stacked type semiconductor device comprising:
    a first semiconductor device including
        a first semiconductor element, and
        a first interposer where the first semiconductor element is mounted, a first electrode pad is formed on one surface, and an external electrode for connecting to the outside is formed on the other surface;
    a second semiconductor device stacked on the first semiconductor device, the second semiconductor device including
        a second semiconductor element, and
        a second interposer where the second semiconductor element is mounted and a second electrode pad is formed on a surface facing the first interposer; and
    a joint material configured to bond the first electrode pad and the second electrode pad together,
    wherein a solder layer and a metal layer bonded to at least one of the first and the second electrode pads are stacked in the joint material, and
    wherein the metal layer includes a metal particle aggregate in which a plurality of metal particles are integrated with voids, and solder which fills at least a part of the voids in the metal particle aggregate.

2. The stacked type semiconductor device according to claim 1, wherein a melting point of the metal particle aggregate is higher than a melting point of the solder.

3. The stacked type semiconductor device according to claim 1, wherein the metal particles are formed of copper or a copper alloy.

4. The stacked type semiconductor device according to claim 1, wherein an outer surface of the metal particle aggregate is covered by solder in the metal layer.

5. A printed circuit board comprising:
    a printed wiring board where a first electrode pad is formed on one surface;
    a semiconductor device mounted on the printed wiring board, the semiconductor device including
        a semiconductor element, and
        an interposer where the semiconductor element is mounted and a second electrode pad is formed on a surface facing the printed wiring board; and
    a joint material configured to bond the first electrode pad and the second electrode pad together,
    wherein a solder layer and a metal layer bonded to at least one of the first and the second electrode pads are stacked in the joint material, and
    wherein the metal layer includes a metal particle aggregate in which a plurality of metal particles are integrated with voids, and solder which fills at least a part of the voids in the metal particle aggregate.

6. The printed circuit board according to claim 5, wherein a melting point of the metal particle aggregate is higher than a melting point of the solder.

7. The printed circuit board according to claim 5, wherein the metal particles are formed of copper or a copper alloy.

8. The printed circuit board according to claim 5, wherein an outer surface of the metal particle aggregate is covered by solder in the metal layer.

9. A printed circuit board comprising:
    a stacked type semiconductor device including
        a first semiconductor device including
            a first semiconductor element, and
            a first interposer where the first semiconductor element is mounted, a first electrode pad is formed on one surface, and an external electrode for connecting to the outside is formed on the other surface,
        a second semiconductor device stacked on the first semiconductor device, the second semiconductor device including
            a second semiconductor element, and
            a second interposer where the second semiconductor element is mounted and a second electrode pad is formed on a surface facing the first interposer, and
            a joint material configured to bond the first electrode pad and the second electrode pad together; and
    a printed wiring board where a third electrode pad is formed on one surface and the stacked type semiconductor device is mounted by bonding the external electrode to the third electrode pad, wherein a solder layer and a metal layer bonded to at least one of the first and the second electrode pads are stacked in the external electrode, and
    wherein the metal layer includes a metal particle aggregate in which a plurality of metal particles are integrated with voids, and solder which fills at least a part of the voids in the metal particle aggregate.

10. The printed circuit board according to claim 9, wherein a melting point of the metal particle aggregate is higher than a melting point of the solder.

11. The printed circuit board according to claim 9, wherein the metal particles are formed of copper or a copper alloy.

12. The printed circuit board according to claim 9, wherein an outer surface of the metal particle aggregate is covered by solder in the metal layer.

13. A printed circuit board comprising:
a stacked type semiconductor device including
a first semiconductor device including
a first semiconductor element, and
a first interposer where the first semiconductor element is mounted, a first electrode pad is formed on one surface, and an external electrode for connecting to the outside is formed on the other surface,
a second semiconductor device stacked on the first semiconductor device, the second semiconductor device including
a second semiconductor element, and
a second interposer where the second semiconductor element is mounted and a second electrode pad is formed on a surface facing the first interposer, and
a joint material configured to bond the first electrode pad and the second electrode pad together; and
a printed wiring board where a third electrode pad is formed on one surface and the stacked type semiconductor device is mounted by bonding the external electrode to the third electrode pad,
wherein a solder layer and a metal layer bonded to at least one of the first and the second electrode pads are stacked in the joint material, and
wherein the metal layer includes a metal particle aggregate in which a plurality of metal particles are integrated with voids, and solder which fills at least a part of the voids in the metal particle aggregate.

14. The printed circuit board according to claim 13, wherein a melting point of the metal particle aggregate is higher than a melting point of the solder.

15. The printed circuit board according to claim 13, wherein the metal particles are formed of copper or a copper alloy.

16. The printed circuit board according to claim 13, wherein an outer surface of the metal particle aggregate is covered by solder in the metal layer.

17. A joint structure of a printed circuit board, the joint structure comprising:
a first wiring board where a first electrode pad is formed on one surface;
a second wiring board where a second electrode pad is formed on one surface facing the first wiring board; and
a joint material configured to bond the first electrode pad and the second electrode pad together,
wherein a solder layer and a metal layer bonded to at least one of the first and the second electrode pads are stacked in the joint material, and
wherein the metal layer includes a metal particle aggregate in which a plurality of metal particles are integrated with voids, and solder which fills at least a part of the voids in the metal particle aggregate.

* * * * *